(12) United States Patent
Wan et al.

(10) Patent No.: US 12,125,704 B2
(45) Date of Patent: Oct. 22, 2024

(54) METHOD FOR FORMING PATTERN

(71) Applicant: CHANGXIN MEMORY TECHNOLOGIES, INC., Hefei (CN)

(72) Inventors: Qiang Wan, Hefei (CN); Jun Xia, Hefei (CN); Kangshu Zhan, Hefei (CN); Penghui Xu, Hefei (CN); Tao Liu, Hefei (CN); Sen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 368 days.

(21) Appl. No.: 17/647,766

(22) Filed: Jan. 12, 2022

(65) Prior Publication Data
US 2023/0013448 A1    Jan. 19, 2023

Related U.S. Application Data

(63) Continuation of application No. PCT/CN2021/117023, filed on Sep. 7, 2021.

(30) Foreign Application Priority Data

Jul. 19, 2021    (CN) .......................... 202110814383.6

(51) Int. Cl.
H01L 21/033        (2006.01)
(52) U.S. Cl.
CPC ...... *H01L 21/0338* (2013.01); *H01L 21/0335* (2013.01); *H01L 21/0337* (2013.01)

(58) Field of Classification Search
CPC ............. H01L 21/0332; H01L 21/0335; H01L 21/0337; H01L 21/0338
See application file for complete search history.

(56) References Cited

U.S. PATENT DOCUMENTS

| | | | |
|---|---|---|---|
| 7,732,341 B2 | 6/2010 | Koh | |
| 8,003,543 B2 | 8/2011 | Koh | |
| 8,278,221 B2 | 10/2012 | Koh | |
| 9,911,619 B1 * | 3/2018 | Xie | ................... H01L 29/66795 |
| 2008/0090419 A1 | 4/2008 | Koh | |
| 2010/0197139 A1 | 8/2010 | Koh | |
| 2011/0269294 A1 | 11/2011 | Koh | |
| 2016/0358770 A1 | 12/2016 | Byung-Jun et al. | |
| 2019/0393036 A1 | 12/2019 | Lin et al. | |

FOREIGN PATENT DOCUMENTS

| | | |
|---|---|---|
| CN | 109585279 A | 4/2019 |
| CN | 112447504 A | 3/2021 |
| CN | 112447513 A | 3/2021 |
| CN | 112951720 A | 6/2021 |

* cited by examiner

*Primary Examiner* — Walter H Swanson
(74) *Attorney, Agent, or Firm* — Syncoda LLC; Feng Ma

(57) ABSTRACT

A method for forming a pattern can include the following operations. A substrate is provided, on the surface of which a patterned photoresist layer is formed. Based on the photoresist layer, isolation sidewalls are formed, in which each isolation sidewall includes a first sidewall close to the photoresist layer and a second sidewall away from the photoresist layer. Core material layers are formed between two adjacent isolation sidewalls. The second sidewalls are removed to form the pattern composed of the first sidewalls and the core material layers.

16 Claims, 10 Drawing Sheets

METHOD FOR FORMING PATTERN

CROSS-REFERENCE TO RELATED APPLICATIONS

The present application is a continuation of International Application No. PCT/CN/2021/117023 filed on Sep. 7, 2021, which claims priority to Chinese Patent Application No. 202110814383.6 filed on Jul. 19, 2021. The disclosures of the above-referenced applications are hereby incorporated by reference in their entirety.

BACKGROUND

With continuous increase in the integration of semiconductor devices, a feature size of a semiconductor device is required to be smaller and smaller, and the double pattern technology (DP) is currently a key technology for achieving smaller-size patterns. Reverse Self-aligned Double Patterning (RSADP) in the double pattern technology is widely used in the manufacture of various semiconductor devices because it can achieve excellent line width and pitch control effects.

SUMMARY

Embodiments of the disclosure relate to but are not limited to a method for forming a pattern.

An embodiment of the disclosure provides a method for forming a pattern, which includes the following operations. A substrate is provided, in which a patterned photoresist layer is formed on a surface of the substrate; based on the photoresist layer, isolation sidewalls are formed, in which each isolation sidewall includes a first sidewall close to the photoresist layer and a second sidewall away from the photoresist layer; core material layers are formed between two adjacent isolation sidewalls; and the second sidewalls are removed to form the pattern composed of the first sidewalls and the core material layers.

BRIEF DESCRIPTION OF THE DRAWINGS

In the accompanying drawings (not necessarily drawn according to a proportion), the similar drawing marks can describe similar parts in different diagrams. The similar drawing marks with different letter suffixes can represent different examples of the similar parts. The drawings show in general every embodiment discussed herein with examples rather than in a limiting manner.

DETAILED DESCRIPTION

Figure 1A:
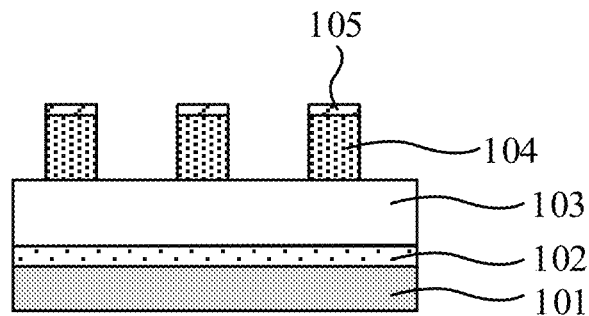
FIG. 1A illustrates a first process flow diagram of a reverse self-aligned double patterning technology in some implementations.

Exemplary embodiments of the disclosure will be described in more detail below with reference to the accompanying drawings. Although the exemplary embodiments of the disclosure are shown in the accompanying drawings, it should be understood that the disclosure may be implemented in various forms and should not be limited by specific implementations set forth herein. On the contrary, these embodiments are provided for understanding the disclosure more thoroughly, and for fully conveying the scope of the disclosure to those skilled in the art.

In the following description, a lot of specific details are given in order to provide a more thorough understanding of the disclosure. However, it is obvious to those skilled in the art that the disclosure may be implemented without one or more of these details. In other examples, in order to avoid confusion with the disclosure, some technical features known in the art are not described; that is, not all the features of actual embodiments are described here, and well-known functions and structures are not described in detail.

In the accompanying drawings, sizes of layers, regions, and elements and their relative sizes may be exaggerated for clarity. The same reference numerals denote the same elements throughout.

It should be understood that when an element or layer is referred to as being "on . . . ", "adjacent to . . . ", "connected to" or "coupled to" other elements or layers, it may be directly on, adjacent to, connected to or coupled to the other elements or layers, or interjacent elements or layers may exit. In contrast, when an element is referred to as being "directly on . . . ", "directly adjacent to . . . ", "directly connected to" or "directly coupled to" other elements or layers, there are no interjacent elements or layers. It should be understood that although the terms first, second, third, etc. may be used to describe various elements, components, regions, layers, and/or portions, these elements, components, regions, layers, and/or portions should not be limited by these terms. These terms are used merely to distinguish one element, component, region, layer, or portion from another element, component, region, layer, or portion. Therefore, a first element, component, region, layer, or portion discussed below may be represented as a second element, component, region, layer, or portion without departing from teachings of the disclosure. When a second element, component, region, layer or portion is discussed, it does not mean that a first element, component, region, layer or portion necessarily exists in the disclosure.

Spatially relational terms such as "below . . . ", "under . . . ", "lower", "beneath . . . ", "above . . . ", "upper" and the like may be used herein for convenience of description to describe a relationship between one element or feature and another element or feature illustrated in the drawings. It should be understood that in addition to the orientation shown in the drawings, the spatially relational terms are intended to further include different orientations of devices in use and operation. For example, if a device in the drawings is turned over, elements or features described as being "under" or "beneath" or "below" other elements or features will be oriented to be "on" the other elements or features. Therefore, the exemplary terms "under . . . " and "below . . . " may include both upper and lower orientations. The device may be otherwise oriented (rotated by 90 degrees or in other orientations) and the spatial descriptors used herein may be interpreted accordingly.

The purpose of the terms used here is only to describe specific embodiments and do not serve as a limitation of the disclosure. As used herein, singular forms "a/an", "one", and "the/said" are also intended to include plural forms as well, unless the context clearly dictates otherwise. It should also be understood that when the terms "composed of" and/or "including/comprising" are used in this specification, the presence of features, integers, steps, operations, elements, and/or components is determined, but the presence or addition of one or more other features, integers, steps, operations, elements, components, and/or groups is also possible. As used herein, the term "and/or" includes any and all combinations of associated listed items.

In an RSADP process in some implementations, when a final pattern is formed by etching, the thickness of a sidewall material layer (such as oxide) is reduced, resulting in the reduction of sizes of etched pores. Therefore, during etching a sidewall, polymers are prone to being formed on sidewalls of the etched pores and causing blockage, which then makes subsequent processes impossible.

FIGS. 1A-1E illustrate process flow diagrams of a reverse self-aligned double patterning technology in some implementations. Before describing a method for forming a pattern in an embodiment of the disclosure in detail, the reverse self-aligned double patterning technology in some implementations is first introduced with reference to FIGS. 1A-1E.

Figure 1B:
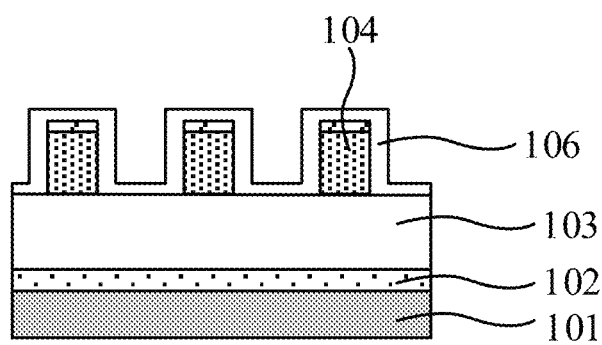
FIG. 1B illustrates a second process flow diagram of a reverse self-aligned double patterning technology in some implementations.

As shown in FIG. 1A, a base 101 is provided, an etching stopping layer 102, a core material layer 103, patterned first mask layers 104 and dielectric layers 105 are sequentially formed on the base 101. The etching stopping layer 102 may be a silicon oxynitride layer, the core material layer 103 may be an oxide layer, the first mask layer 104 may be a spin on carbon (SOC) layer, the patterned first mask layers include a plurality of patterns spaced apart from each other, the dielectric layers 105 are located on the surfaces of the patterned mask layers 104, and the dielectric layers 105 may also be a silicon oxynitride layer. As shown in FIG. 1B, a sidewall material layer 106 is formed on the surface of the core material layer 103, the sidewalls of the patterned first mask layers 104 and the surfaces of the dielectric layers 105. The material of the sidewall material layer 106 may be the same as or different from that of the core material layers 103. For example, the sidewall material layer 106 may also be an oxide layer.

Figure 1C:
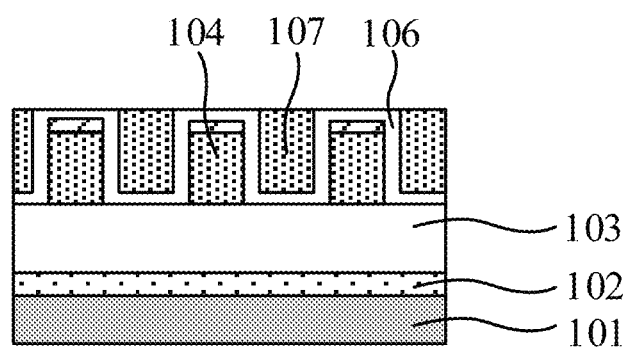
FIG. 1C illustrates a third process flow diagram of a reverse self-aligned double patterning technology in some implementations.
Figure 1D:
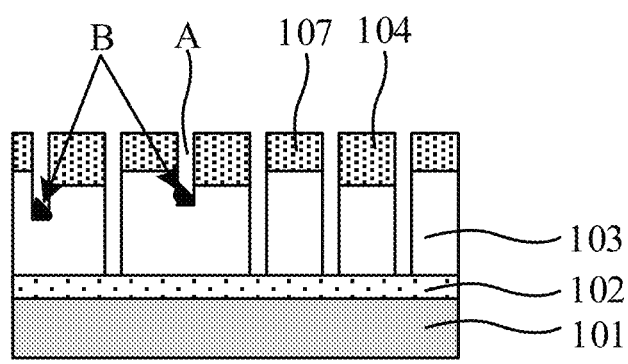
FIG. 1D illustrates a fourth process flow diagram of a reverse self-aligned double patterning technology in some implementations.
Figure 1E:
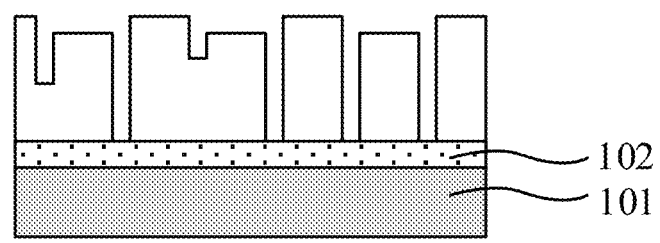
FIG. 1E illustrates a fifth process flow diagram of a reverse self-aligned double patterning technology in some implementations.

Next, as shown in FIG. 1C, a mask material is deposited on the surface of the sidewall material layer 106 and is processed to form second mask layers 107. In addition, the second mask layers 107 and the first mask layers 104 are alternately arranged, the surfaces of the second mask layers 107 are flush with the surface of the sidewall material layer 106, and the second mask layers 107 may also be an SOC layer. As shown in FIG. 1D, the sidewall material layer between the first mask layers 104 and the second mask layers 107 as well as the corresponding core material layer are etched until a surface of the etching stopping layer 102 is exposed, so as to realize the formation of a final pattern in the core material layer 103.

However, during the formation of the final patterns by etching, a polymer B is prone to being formed in an etched pore A due to poor shape-preserving ability of photoresist. A thickness of the sidewall material layer is reduced, resulting in the reduction of a size of the etched pore A, so the formed polymer B is not easily removed in the etched pore A, which causes blockage and then forms a pattern shown in FIG. 1E. Because the polymer B is blocked in the etched pore A, subsequent processes cannot be performed, and consequently, the final accurate patterns cannot be formed.

Figure 2:
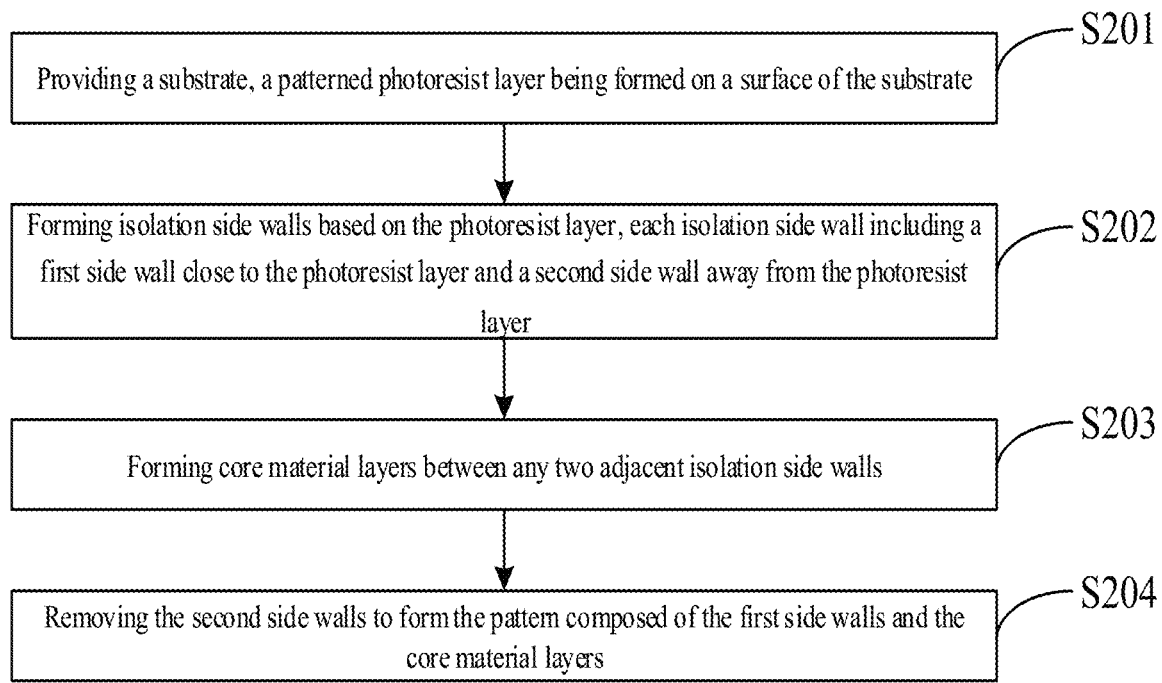
FIG. 2 illustrates a flowchart diagram of a method for forming a pattern provided by an embodiment of the disclosure.

Based on the aforesaid problem in some implementations, an embodiment of the disclosure provides a method for forming a pattern. FIG. 2 illustrates a flowchart of the method for forming the pattern provided by the embodiment of the disclosure. As shown in FIG. 2, the method includes the following operations.

At S201, a substrate is provided, in which a patterned photoresist layer is formed on a surface of the substrate.

In the embodiment of the disclosure, the substrate may be a base. In other embodiments, the base is a silicon base, or the base may further include other semiconductor elements, such as germanium, or include a semiconductor compound, such as silicon carbide, gallium arsenide, gallium phosphide, indium phosphide, indium arsenide or indium antimonide, or include other semiconductor alloys, such as silicon germanium, gallium arsenide phosphide, indium arsenide aluminum, aluminum gallium arsenide, indium gallium arsenide, indium gallium phosphide, and/or indium gallium arsenide phosphide or a combination thereof.

In other embodiments, the substrate may include a base and an etching stopping layer on a surface of the base. A material of the etching stopping layer may be silicon carbide, silicon oxide, silicon nitride or silicon oxynitride.

In the embodiment of the disclosure, the patterned photoresist layer is located on a surface of the etching stopping layer. In other embodiments, the patterned photoresist layer may be located on the surface of the base.

The patterned photoresist layer includes a plurality of initial sub-patterns spaced apart from each other. In the embodiment of the disclosure, the reverse self-aligned double patterning technology is realized through the plurality of initial sub-patterns spaced apart from each other.

At S202, isolation sidewalls are formed based on the photoresist layer.

Each isolation sidewall includes a first sidewall close to the photoresist layer and a second sidewall away from the photoresist layer.

In the embodiment of the disclosure, after the isolation sidewalls are formed based on the photoresist layer, the photoresist layer is removed. Each formed isolation sidewall includes two layers, namely the first sidewall and the second sidewall. Relative to every initial sub-pattern in the photoresist layer, the second sidewall is located outside the first sidewall. Herein, the first sidewalls and the second sidewalls may be in touch with each other.

At S203, core material layers are formed between two adjacent isolation sidewalls.

In the embodiment of the disclosure, the core material layers are used for forming a final etched pattern. The core material layers may be an oxide layer, a spin on carbon layer or other material layer.

At S204, the second sidewalls are removed to form the pattern composed of the first sidewalls and the core material layers.

The method for forming the pattern provided by the embodiment of the disclosure can solve the problem of polymer blockage in an etching process caused by reduction of the thickness of sidewalls in some implementations, and can accurately form the final pattern.

FIGS. 3A-3I illustrate a flow diagram of forming a pattern provided by an embodiment of the disclosure. The method for forming the pattern provided by the embodiment of the disclosure will be further described in detail with reference to FIGS. 3A-3I.

Figure 3A:
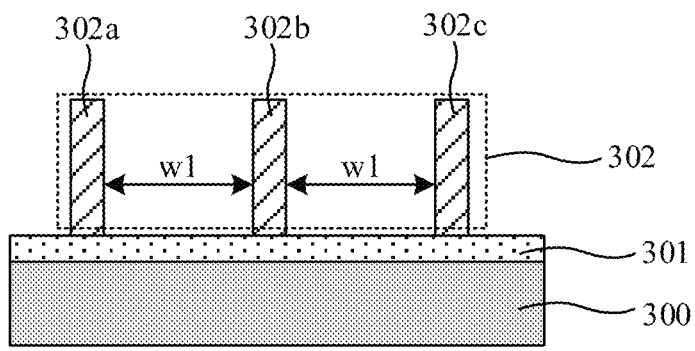
FIG. 3A illustrates a first flow diagram of forming a pattern provided by an embodiment of the disclosure.

First, S201 is executed with reference to FIG. 3A. A substrate is provided, on the surface of which at least the patterned photoresist layer is formed.

As shown in FIG. 3A, the substrate includes the base 300 and the etching stopping layer 301 on the surface of the base, and the patterned photoresist layer 302 is formed on the surface of the etching stopping layer 301. The etching stopping layer 301 may be a silicon carbide layer, a silicon oxide layer, a silicon nitride layer, a silicon oxynitride layer, a polysilicon layer or other material layers. The patterned photoresist layer 302 includes the plurality of initial sub-patterns spaced apart from each other (for example, 302a, 302b and 302c). The spacing between two adjacent initial sub-patterns may be equal or may be different. In the embodiment of the disclosure, the initial sub-patterns are arranged equidistantly. For example, two adjacent initial sub-patterns are spaced apart with the first preset distance w1.

Next, S202 is executed with reference to FIGS. 3B-3F. The isolation sidewalls are formed based on the photoresist layer.

In some embodiments, S202 may be realized with the following operations.

At S2021, sidewall material layer is formed, which is arranged on the surface of the substrate and the top and the sidewalls of the photoresist layer and includes a first sidewall material layer and a second sidewall material layer which are formed in sequence.

The first sidewall material layer is close to the photoresist layer and the second sidewall material layer is away from the photoresist layer. The first sidewall material layer and the second sidewall material layer are in contact with each other.

In some embodiments, the substrate may include a base or the base and an etching stopping layer on a surface of the base. The patterned photoresist layer is located on the surface of the etching stopping layer. S2021 may include the following operations.

At S1, the first sidewall material is deposited on the surface of the etching stopping layer and at the top and sidewalls of the photoresist layer to form the first sidewall material layer.

In the embodiment of the disclosure, the first sidewall material may be deposited by chemical vapor deposition (CVD), physical vapor deposition (PVD), atomic layer deposition (ALD), spin coating, coating or other processes, so as to form the first sidewall material layer.

Figure 3B:
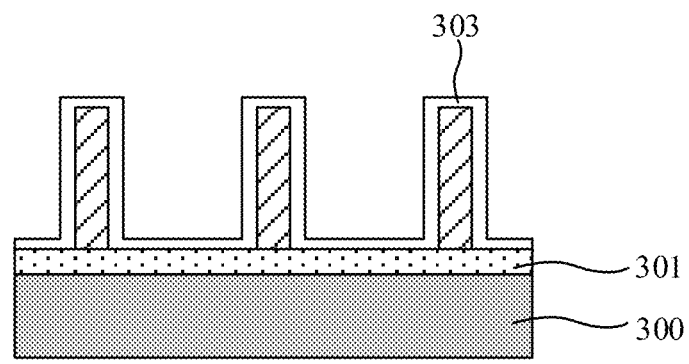
FIG. 3B illustrates a second flow diagram of forming a pattern provided by an embodiment of the disclosure.

As shown in FIG. 3B, the first sidewall material is deposited on the surface of the etching stopping layer 301 and the top and the sidewalls of the patterned photoresist layer to form the first sidewall material layer 303. The first sidewall material may be an oxide, a carbon material or other material.

At S2, a part of the first sidewall material layer located on the surface of the etching stopping layer is removed by adopting a dry etching process, and the first sidewall material layer on the surface of the photoresist layer are reserved.

The dry etching process may be a plasma etching process, a reactive ion etching process or an ion beam milling process.

Figure 3C:
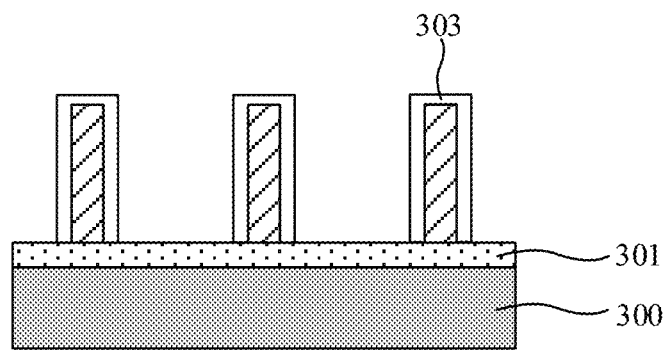
FIG. 3C illustrates a third flow diagram of forming a pattern provided by an embodiment of the disclosure.

As shown in FIG. 3C, the part of the first sidewall material layer located on the surface of the etching stopping layer 301 is removed to expose the surface of the etching stopping layer 301, and the first sidewall material layer 303 on the surface of the photoresist layer is reserved.

At S3, a second sidewall material is deposited on the etching stopping layer and the surface of the first sidewall material layer to form the second sidewall material layer.

The second sidewall material may be deposited on the etching stopping layer and the surface of the first sidewall material layer by proper deposition process. The second sidewall material may be silicon nitride, silicon oxynitride or other material.

In some embodiments, the thickness of the second sidewall material layer is larger than that of the first sidewall material layer.

In the embodiment of the disclosure, the etching selection ratio of the second sidewall material relative to the first sidewall material is high. That is, under the same etching condition, the second sidewall material is easier to be removed.

Figure 3D:
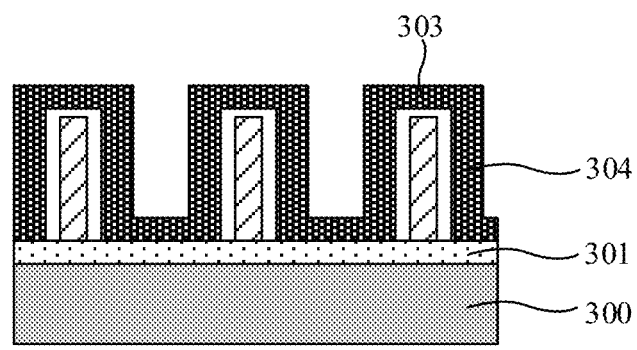
FIG. 3D illustrates a fourth flow diagram of forming a pattern provided by an embodiment of the disclosure.

As shown in FIG. 3D, the second sidewall material is deposited on the etching stopping layer 301 and the surface of the first sidewall material layer 303 to form the second sidewall material layer 304.

At S2022, a part of the sidewall material layers is removed until the surface of the photoresist layer and the substrate are exposed.

In some embodiments, in S2022, removing a part of the sidewall material layers refers to removing the second sidewall material layer on the surface of the substrate, and removing the second sidewall material layer and first sidewall material layer at the top of the photoresist layer, and thus reserving the second sidewall material layer and the first sidewall material layer on the sidewalls of the photoresist layer.

In some embodiments, said removing a part of the sidewall material layers until the photoresist layer and the surface of the substrate are exposed includes the following operation. Etching treatment is performed, by adopting a dry etching process, on the second sidewall material layer on the surface of the substrate and the second sidewall material layer and first sidewall material layer at the top of the photoresist layer, until the photoresist layer and the surface of the substrate are exposed.

In other embodiments, the second sidewall material layer and first sidewall material layer at the top of the photoresist layer may also be removed by adopting a chemical mechanical polishing technology.

Figure 3E:
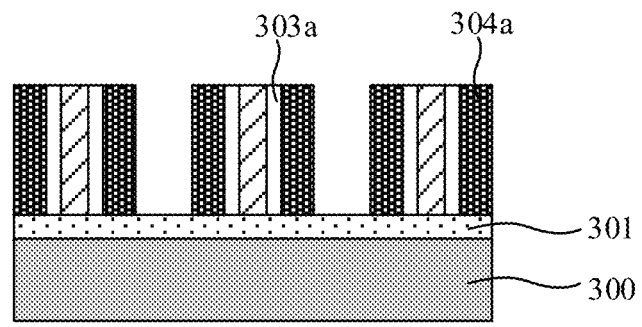
FIG. 3E illustrates a fifth flow diagram of forming a pattern provided by an embodiment of the disclosure.

As shown in FIG. 3E, the second sidewall material layer and first sidewall material layer at the top of the photoresist layer are removed, moreover, the second sidewall material layer on the surface of the etching stopping layer 301 is removed, and the surfaces of the photoresist layer and the etching stopping layer 303 are exposed. The second sidewall material layer and the first sidewall material layer on the sidewalls of the photoresist layer are reserved, in addition, the reserved first sidewall material layer form the first sidewalls 303a and the reserved second sidewall material layer form the second sidewalls 304a.

In some embodiments, the etching selection ratio of the second sidewall material relative to the material of the etching stopping layer is high. That is, the second sidewall material is easier to be removed than that of the etching stopping layer.

At S2023, the photoresist layer is removed to form the isolation sidewalls.

Figure 3F:
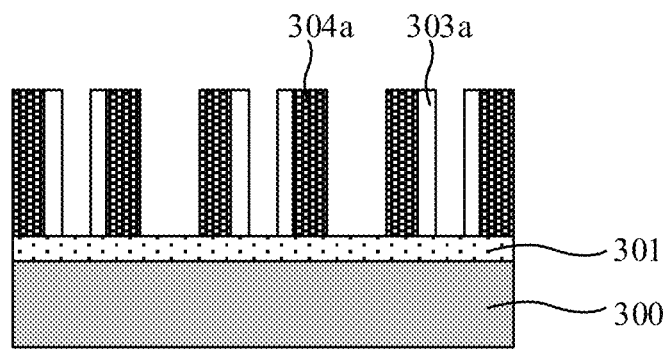
FIG. 3F illustrates a sixth flow diagram of forming a pattern provided by an embodiment of the disclosure.

As shown in FIG. 3F, the photoresist layer located between adjacent first sidewalls 303a is removed to form the isolation sidewalls.

The photoresist layer may be removed by a dry etching technology or a wet etching technology.

Figure 3G:
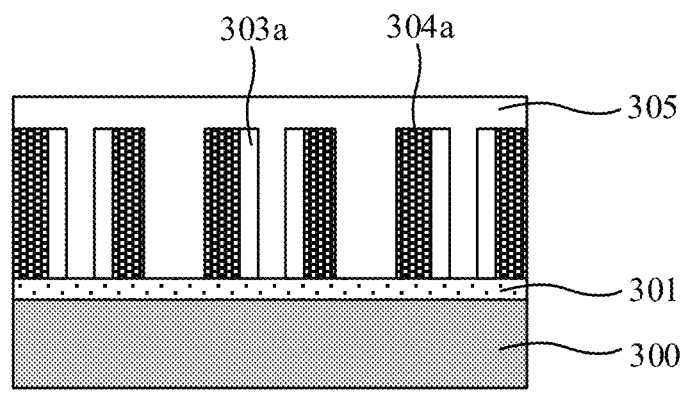
FIG. 3G illustrates a seventh flow diagram of forming a pattern provided by an embodiment of the disclosure.
Figure 3H:
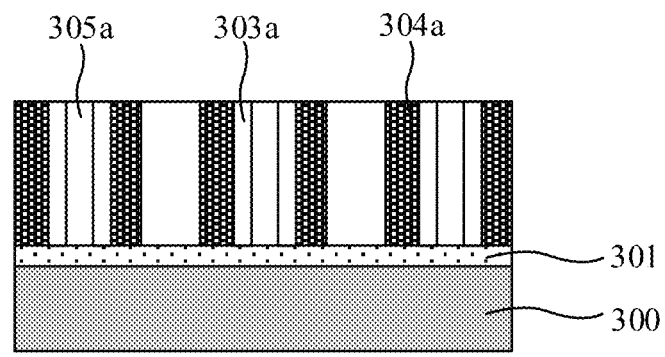
FIG. 3H illustrates an eighth flow diagram of forming a pattern provided by an embodiment of the disclosure.

Next, S203 is executed with reference to FIGS. 3G and 3H. The core material layers are formed between two adjacent isolation sidewalls.

In some embodiments, S203 may include the following operations.

At S2031, an initial core material layer covering the isolation sidewalls is formed, and the initial core material layer is arranged on the etching stopping layer and surfaces of the isolation sidewalls.

In the embodiment of the disclosure, the initial core material layer may be formed by any proper deposition process, such as a spin coating process.

In some embodiments, the core material may be the same as or different from the first sidewall material of the first sidewall material layer. When the core material and the first sidewall material are different, the first sidewall material has the same etching rate as the core material. That is, when the core material and the first sidewall material are different, the core materials and the first sidewall materials can be removed at the same time under the same etching condition.

As shown in FIG. 3G, the core material is deposited on the etching stopping layer 301 and the surfaces of the sidewalls to form the initial core material layer 305 covering the sidewalls. In the embodiment of the disclosure, the core materials are the same as the first sidewall material constituting the first sidewalls 303a.

At S2031, a part of the initial core material layer is removed to form the core material layers between two adjacent isolation sidewalls. In some embodiments, S2031 may be realized in the following two manners.

Manner 1: back etching is performed, by dry etching, on the initial core material layer to remove the initial core material layer on top surfaces of the isolation sidewalls, thereby exposing top surfaces of the second sidewalls to form the core material layers between two adjacent isolation sidewalls.

Manner 2: chemical mechanical polishing treatment is performed on the initial core material layer to remove the initial core material layer on top surfaces of the isolation sidewalls, thereby exposing top surfaces of the second sidewalls to form the core material layers between two adjacent isolation sidewalls.

As shown in FIG. 3H, the initial core material layer on the top surfaces of the isolation sidewalls is removed by the dry etching technology or chemical mechanical polishing treatment to form the core material layers 305a between two adjacent isolation sidewalls.

Figure 3I:
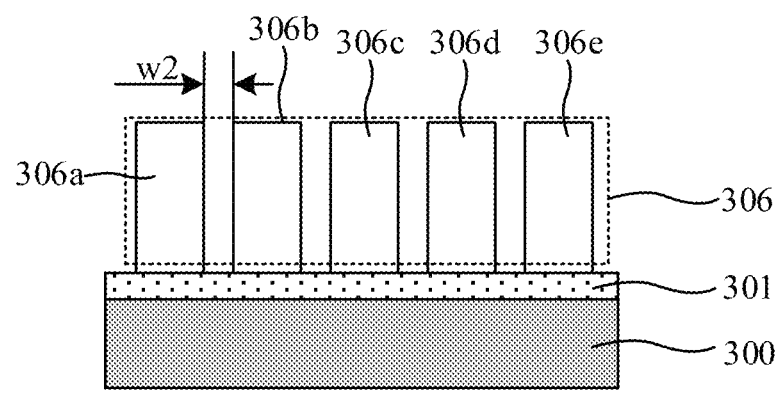
FIG. 3I illustrate a ninth flow diagram of forming a pattern provided by an embodiment of the disclosure.

Next, S204 is executed with reference to FIG. 3I. The second sidewalls are removed to form the pattern composed of the first sidewalls and the core material layers.

In the embodiment of the disclosure, the second sidewalls may be removed by a wet etching technology. For example, a preset etchant solution is used to etch and remove the second sidewalls. The preset etchant solution may be a phosphoric acid solution, a hydrofluoric acid solution or a sulfuric acid solution.

As shown in FIG. 3I, the second sidewalls 304a are removed to form the pattern 306 composed of the first sidewalls 303a and the core material layers 305a.

In the embodiment of the disclosure, the pattern 306 includes a plurality of sub-patterns spaced apart from each other (such as 306a, 306b, 306c, 306d, and 306e). A second present distance w2 exists between two adjacent sub-patterns. The first preset distance w1 is larger than the second preset distance w2.

In the embodiment of the disclosure, three initial sub-patterns 302a, 302b, and 302c finally form 5 sub-patterns 306a, 306b, 306c, 306d, and 306e through the self-aligned double patterning technology. In this way, without altering the size of an etching window, ⅗ of a minimum size can be achieved, thereby increasing the density of semiconductor integrated circuits.

In the embodiment of the disclosure, the first preset thickness of the first sidewall material layer forming the first sidewalls is less than the second preset thickness of the second sidewall material layer forming the second sidewalls. In this way, the spacing between the sub-patterns of the finally formed pattern is proper, so other structures may be conveniently formed on the final pattern.

An embodiment of the disclosure provides a new RSADP process. A polysilicon stopping layer and a dry or wet etching process similar to NON structure (air gap formation process) is used to solve the problem of polymer blockage in sidewall etching due to the reduction of the thickness of a sidewall material layer in the RSADP process in some implementations.

FIGS. 4A-4I illustrate another flow diagram of forming a pattern provided by an embodiment of the disclosure. The method for forming the pattern provided by the embodiment of the disclosure will be further described in detail with reference to FIGS. 4A-4I.

Figure 4A:
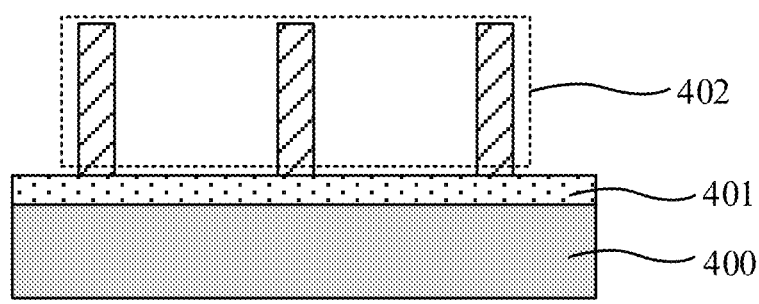
FIG. 4A illustrates another first flow diagram of forming a pattern provided by an embodiment of the disclosure.

First, S201 is executed with reference to FIG. 4A. A substrate is provided, and the patterned photoresist layer is formed on the surface of the substrate.

In the embodiment of the disclosure, the substrate may include a base, or may include a base and an etching stopping layer on the surface of the base.

As shown in FIG. 4A, the substrate includes the base 400 and the etching stopping layer 401 on the surface of the base, and the patterned photoresist layer 402 is formed on the surface of the etching stopping layer 401. The patterned photoresist layer 402 includes the plurality of initial sub-patterns spaced apart from each other.

In the embodiment of the disclosure, the base 400, the etching stopping layer 401 and the patterned photoresist layer 402 are respectively similar to the base 300, the etching stopping layer 401 and the patterned photoresist layer 302 in the aforesaid embodiment, and repetition will not be made here.

Next, S202 may be executed with reference to FIGS. 4B-4E. The isolation sidewalls are formed based on the photoresist layer.

In some embodiments, S202 may be realized through the following operations.

At S2021, sidewall material layer is formed, the sidewall material layer is arranged on the surface of the substrate and a top and sidewalls of the photoresist layer, and each sidewall material layer includes a first sidewall material layer and a second sidewall material layer which are formed in sequence.

The first sidewall material layer is close to the photoresist layer and the second sidewall material layer is away from the photoresist layer. The first sidewall material layer and the second sidewall material layer are in contact with each other.

In some embodiments, S2021 may include the following operations.

At S1, a first sidewall material is deposited on the surface of the etching stopping layer and at the top and sidewalls of the photoresist layer to form the first sidewall material layer.

In the embodiment of the disclosure, the first sidewall material may be deposited by CVD, PVD, ALD, spin coating, coating or other processes, so as to form the first sidewall material layer.

Figure 4B:
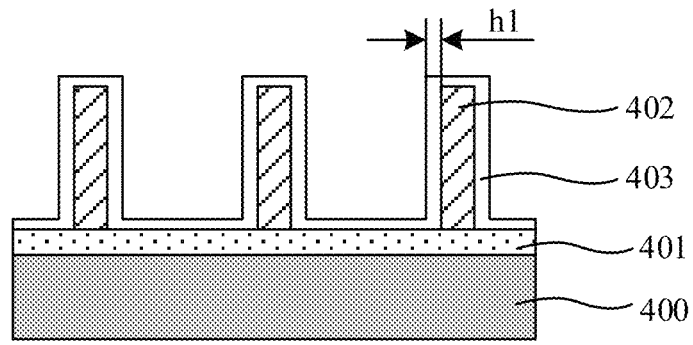
FIG. 4B illustrates another second flow diagram of forming a pattern provided by an embodiment of the disclosure.

As shown in FIG. 4B, the first sidewall material is deposited on the surface of the etching stopping layer 401 and the top and the sidewalls of the photoresist layer 402 to form the first sidewall material layer 403. The first sidewall material may be oxide, carbon materials or other materials. In the embodiment of the disclosure, the first sidewall material layer has a first preset thickness h1.

At S2, a second sidewall material is deposited on the surface of the first sidewall material layer to form the second sidewall material layer.

The second sidewall material may be silicon nitride, silicon oxynitride or other materials.

Figure 4C:
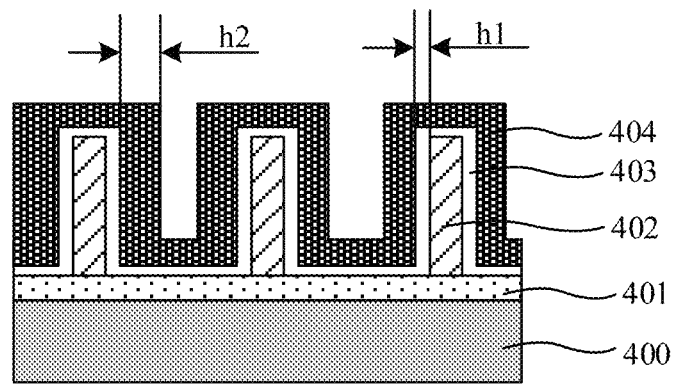
FIG. 4C illustrates another third flow diagram of forming a pattern provided by an embodiment of the disclosure.

As shown in FIG. 4C, the second sidewall material is deposited on the surfaces of the first sidewall material layer 403 to form the second sidewall material layer 404. The second sidewall material layer has a second preset thickness h2. The first preset thickness h1 is less than the second preset thickness h2.

In embodiment of the disclosure, the etching selection ratio of the second sidewall material relative to the first sidewall material is high. That is, under the same etching condition, the second sidewall material is easier to be removed.

At S2022, a part of the sidewall material layer is removed until the photoresist layer and the surface of the substrate are exposed.

In some embodiments, said removing part of the sidewall material layer until the photoresist layer and the surface of the substrate are exposed includes the following operation, etching treatment is performed, by dry etching, on the second sidewall material layer and first sidewall material layer on the surface of the substrate and the top of the photoresist layer, until the photoresist layer and the surface of the substrate are exposed.

In other embodiments, the second sidewall material layer and first sidewall material layer at the top of the photoresist layer may also be removed by adopting a chemical mechanical polishing technology.

Figure 4D:
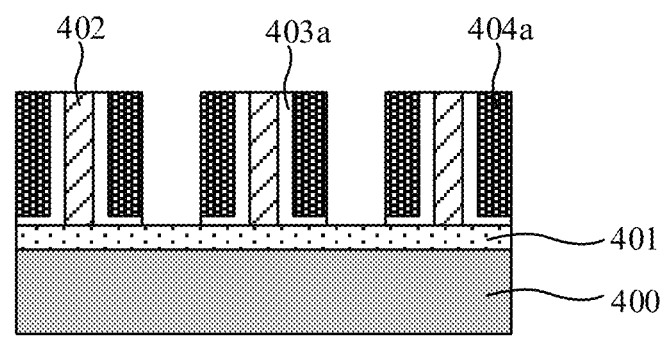
FIG. 4D illustrates another fourth flow diagram of forming a pattern provided by an embodiment of the disclosure.

As shown in FIG. 4D, the second sidewall material layer and first sidewall material layer at the top of the photoresist layer are removed, the second sidewall material layer and first sidewall material layer on the surface of the etching stopping layer 401 are removed at the same time, and the photoresist layer and the surface of the etching stopping layer 401 are exposed. The second sidewall material layer and first sidewall material layer on the sidewalls of the photoresist layer are reserved, furthermore, the reserved first sidewall material layer forms the first sidewalls 403a and the reserved second sidewall material layer forms the second sidewalls 404a.

In some embodiments, the etching selection ratio of the second sidewall material relative to a material of the etching stopping layer is high. That is, the second sidewall material is easier to be removed than that of the etching stopping layer.

At S2023, the photoresist layer is removed to form the isolation sidewalls.

Figure 4E:
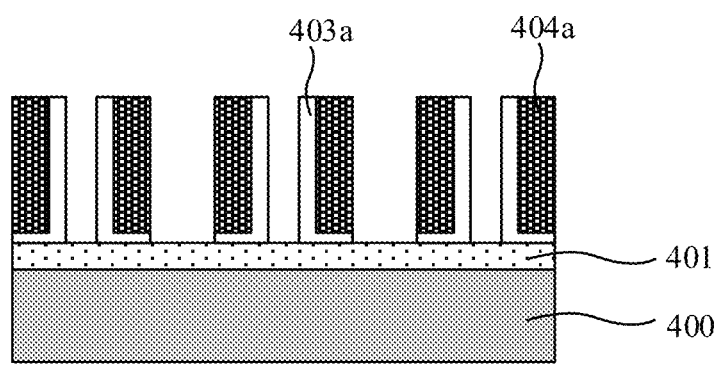
FIG. 4E illustrates another fifth flow diagram of forming a pattern provided by an embodiment of the disclosure.

As shown in FIG. 4E, the photoresist layer located between adjacent first sidewalls 403a is removed to form the isolation sidewalls.

Figure 4F:
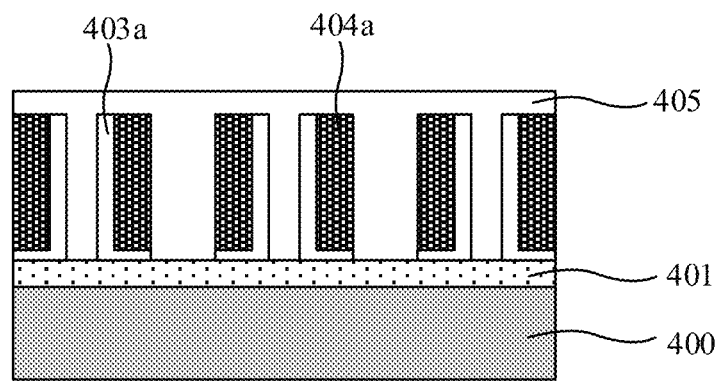
FIG. 4F illustrates another sixth flow diagram of forming a pattern provided by an embodiment of the disclosure.
Figure 4G:
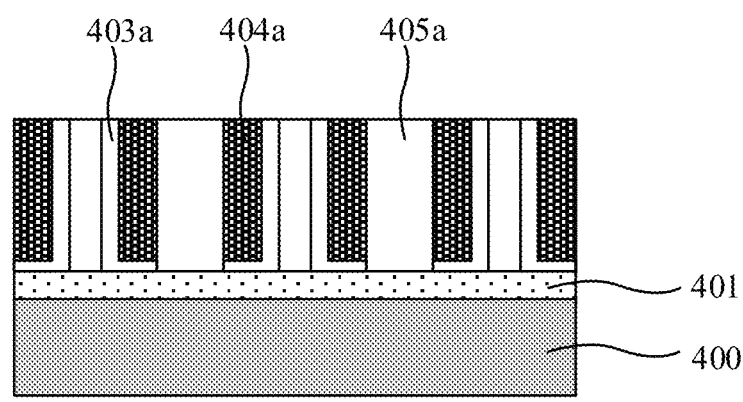
FIG. 4G illustrates another seventh flow diagram of forming a pattern provided by an embodiment of the disclosure.

Next, S203 is executed with reference to FIGS. 4F and 4G. The core material layers are formed between two adjacent isolation sidewalls.

In the embodiment of the disclosure, an implementation process of S203 is the same as the implementation process of S203 in the aforesaid embodiment, and detailed technical features disclosed in the embodiment of the disclosure should be understood with reference to the aforesaid embodiment, which will not be repeated here.

As shown in FIG. 4F, the core material is deposited on the etching stopping layer 401 and the surfaces of the isolation sidewalls to form the initial core material layer 405 covering the isolation sidewalls. In the embodiment of the disclosure, the core material is the same as the first sidewall material constituting the first sidewalls 403a. As shown in FIG. 4G, the initial core material layer on the top surface of the isolation sidewalls is removed to form the core material layers 405a between two adjacent isolation sidewalls.

Figure 4H:
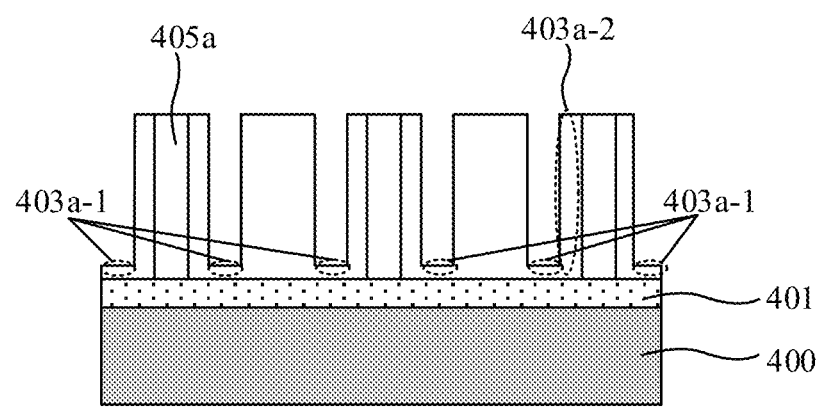
FIG. 4H illustrates another eighth flow diagram of forming a pattern provided by an embodiment of the disclosure.
Figure 4I:
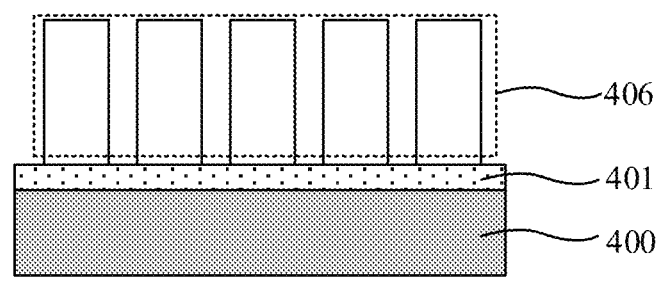
FIG. 4I illustrates another ninth flow diagram of forming a pattern provided by an embodiment of the disclosure.

Next, S204 is executed with reference to FIGS. 4H and 4I. The second sidewalls are removed to form the pattern composed of the first sidewall and the core material layers.

In the embodiment of the disclosure, the second sidewalls may be removed by a wet etching technology. For example, a preset etchant solution is used to etch and remove the second sidewalls. The preset etchant solution may be a phosphoric acid solution, a hydrofluoric acid solution or a sulfuric acid solution.

As shown in FIG. 4H, the second sidewalls 404a are removed to form the pattern composed of the first sidewalls 403a and the core material layers 405a. At the moment, the formed pattern is not a final pattern.

In some embodiments, after removing the second sidewalls, the method for forming the pattern further includes the following operations.

At S205, the part of the first sidewall material layer between the second sidewalls and the etching stopping layer is removed by a dry etching process.

The dry etching process may be a plasma etching process, a reactive ion etching process or an ion beam milling process. In the embodiment of the disclosure, a plasma etching process is adopted to remove the part of the first sidewall material layer between the second sidewalls and the etching stopping layer.

As shown in FIGS. 4H and 4I, the part of the first sidewall material layer 403a-1 between the second sidewalls (which have been removed, i.e., corresponding to pore positions in FIG. 4I) and the etching stopping layer 401 is removed, and reserved first sidewall material layer 403a-2 and the core material layers 405a constitute the final pattern 406.

In the embodiment of the disclosure, a first preset thickness of the first sidewall material layer forming the first sidewalls is less than a second preset thickness of the second sidewall material layer forming the second sidewalls. In this way, the spacing between the sub-patterns of the finally formed pattern is proper, so other structures may be conveniently formed on the final pattern.

In the embodiment of the disclosure, the formed pattern 406 is the same as the pattern 306 formed in the aforesaid embodiment, which may be understood with reference to the aforesaid embodiment.

The method for forming the pattern provided by the embodiment of the disclosure can solve the problem of polymer blockage in an etching process caused by reduction of the thickness of sidewalls in some implementations, and can accurately form the final pattern.

In the several embodiments provided in the disclosure, it should be understood that disclosed equipment and method may be implemented in a non-target manner. The embodiments of the described equipment are only schematic, for example, partition of a unit is only a logic functional partition, and there may be other partition manners in actual application. For instance: multiple units or components may be combined, or may be integrated to another system, or some characteristics may be neglected, or not executed. In addition, displayed or discussed constituent parts are coupled or directly coupled to each other.

The units illustrated as separate components may be, or may not be physically separated, and components displayed as units may be, or may not be physical units, i.e., they may be located in one place, and may also be distributed to multiple network units; a part of or all units therein may be selected according to actual requirements to realize the aim of the solution of the embodiment.

The features disclosed in the several method or equipment embodiments provided by the disclosure may be combined arbitrarily without conflict, so as to obtain a new method embodiment or equipment embodiment.

The foregoing descriptions are merely some embodiments of the disclosure, but the protection scope of the disclosure is not limited thereto. Any changes or replacements within the technical scope disclosed by the disclosure made by those skilled in the art should fall within the protection scope of the disclosure. Therefore, the protection scope of the disclosure should be subject to the appended claims.

What is claimed is:

1. A method for forming a pattern, comprising:
    providing a substrate, wherein a patterned photoresist layer is formed on a surface of the substrate;
    forming an isolation sidewall based on the patterned photoresist layer, wherein the isolation sidewall comprises a first sidewall close to a side surface of the patterned photoresist layer and a second sidewall away from the side surface of the patterned photoresist layer;
    forming core material layers between two adjacent isolation sidewalls; and
    removing the second sidewall to form the pattern composed of the first sidewall and the core material layers.

2. The method of claim 1, wherein said forming the isolation sidewall based on the patterned photoresist layer comprises:
    forming a sidewall material layer, wherein the sidewall material layer is arranged on the surface of the substrate and a top surface and the side surface of the patterned photoresist layer, and the sidewall material layer comprises a first sidewall material layer and a second sidewall material layer which are formed in sequence;
    removing a part of the sidewall material layer until the top surface of the patterned photoresist layer and the surface of the substrate are exposed; and
    removing the patterned photoresist layer to form the isolation sidewall, wherein reserved first sidewall material layer forms the first sidewall and reserved second sidewall material layer forms the second sidewall.

3. The method of claim 2, wherein the substrate comprises a base and an etching stopping layer on a surface of the base, and the patterned photoresist layer is located on a surface of the etching stopping layer; and
    the forming the sidewall material layer comprises:
    depositing a first sidewall material on the surface of the etching stopping layer and the top surface and the side surface of the patterned photoresist layer to form the first sidewall material layer; and
    depositing a second sidewall material on a surface of the first sidewall material layer to form the second sidewall material layer.

4. The method of claim 3, wherein the first sidewall material layer has a first preset thickness, and the second sidewall material layer has a second preset thickness, wherein
    the first preset thickness is less than the second preset thickness.

5. The method of claim 3, wherein an etching selection ratio of the second sidewall material relative to the first sidewall material is high.

6. The method of claim 3, further comprising: after removing the second sidewall,
    removing a part of the first sidewall material layer located between the second sidewall and the etching stopping layer by a dry etching process.

7. The method of claim 6, wherein said removing the part of the sidewall material layer until the surface of the patterned photoresist layer and the surface of the substrate are exposed comprises:
    performing etching treatment on the second sidewall material layer and the first sidewall material layer at the top of the patterned photoresist layer and on the surface of the substrate by a dry etching process, until the surface of the patterned photoresist layer and the substrate are exposed.

8. The method of claim 3, further comprising: after forming the first sidewall material layer, and before forming the second sidewall material layer,
    removing a part of the first sidewall material layer on the surface of the etching stopping layer by adopting a dry etching process, the first sidewall material layer being reserved on the surface of the patterned photoresist layer.

9. The method of claim 8, wherein said removing the part of the sidewall material layer until the top surface of the patterned photoresist layer and the surface of the substrate are exposed comprises:
    performing an etching treatment on the second sidewall material layer and the first sidewall material layer at the top surface of the patterned photoresist layer as well as the second sidewall material layer on the surface of the etching stopping layer by the dry etching process, until the top surface of the patterned photoresist layer and the surface of the etching stopping layer are exposed.

10. The method of claim 1, wherein the patterned photoresist layer comprises multiple initial sub-patterns spaced apart from each other, and a first preset distance exists between two adjacent initial sub-patterns.

11. The method of claim 10, wherein the second sidewall are removed by a wet etching technology to form the pattern, the pattern comprises multiple sub-patterns spaced apart from each other, and a second preset distance exists between two adjacent sub-patterns; wherein the first preset distance is larger than the second preset distance.

12. The method of claim 3, wherein said forming the core material layers between the two adjacent isolation sidewalls comprises:

forming an initial core material layer covering the isolation sidewalls, wherein the initial core material layer is arranged on the surface of the etching stopping layer and top surfaces of the isolation sidewalls; and removing a part of the initial core material layer to form the core material layers between the two adjacent isolation sidewalls.

13. The method of claim 12, wherein said removing the part of the initial core material layer to form the core material layers between the two adjacent isolation sidewalls comprises:

performing back etching on the initial core material layer to remove the part of the initial core material layer on the top surfaces of the isolation sidewalls by a dry etching process and form the core material layers between the two adjacent isolation sidewalls.

14. The method of claim 12, wherein said removing the part of the initial core material layer to form the core material layers between the two adjacent isolation sidewalls comprises:

performing a chemical mechanical polishing treatment on the initial core material layer to remove the part of the initial core material layer on the top surfaces of the isolation sidewalls and form the core material layers between the two adjacent isolation sidewalls.

15. The method of claim 13, wherein the first sidewall material is the same as a core material or the first sidewall material has a same etching rate as the core material.

16. The method of claim 14, wherein the first sidewall material is the same as a core material or the first sidewall material has a same etching rate as the core material.

\* \* \* \* \*